United States Patent
Tanaka

(10) Patent No.: US 7,916,268 B2
(45) Date of Patent: Mar. 29, 2011

(54) SUBSTRATE CARRYING DEVICE, SUBSTRATE CARRYING METHOD, AND EXPOSURE DEVICE

(75) Inventor: Keiichi Tanaka, Saitama (JP)

(73) Assignee: Nikon Corporation, Tokyo (JP)

( * ) Notice: Subject to any disclaimer, the term of this patent is extended or adjusted under 35 U.S.C. 154(b) by 359 days.

(21) Appl. No.: 11/667,597

(22) PCT Filed: Nov. 11, 2005

(86) PCT No.: PCT/JP2005/020704
§ 371 (c)(1),
(2), (4) Date: May 11, 2007

(87) PCT Pub. No.: WO2006/051896
PCT Pub. Date: May 18, 2006

(65) Prior Publication Data
US 2007/0297887 A1 Dec. 27, 2007

(30) Foreign Application Priority Data
Nov. 15, 2004 (JP) .................. 2004-330356

(51) Int. Cl.
*G03B 27/32* (2006.01)
*G03B 27/42* (2006.01)
*G03B 27/52* (2006.01)
*G03B 27/62* (2006.01)

(52) U.S. Cl. ............... 355/30; 355/53; 355/75; 355/77

(58) Field of Classification Search ............... 355/53, 355/67, 75, 30, 77; 414/591, 935; 378/34–35; 250/492.2; 310/12.01–12.06, 12.29; 318/649; 430/5
See application file for complete search history.

(56) References Cited

U.S. PATENT DOCUMENTS
4,534,695 A 8/1985 Stump et al.
(Continued)

FOREIGN PATENT DOCUMENTS
EP 1 039 510 A1 9/2000
(Continued)

OTHER PUBLICATIONS
Japanese Search Report dated Feb. 14, 2006 for International Application No. PCT/JP2005/020704, 2 pages.
(Continued)

*Primary Examiner* — Hung Henry Nguyen
*Assistant Examiner* — Colin Kreutzer
(74) *Attorney, Agent, or Firm* — Finnegan, Henderson, Farabow, Garrett & Dunner LLP

(57) ABSTRACT

The present invention relates to a substrate carrying device that carries a substrate such as a reticle, a substrate carrying method, and an exposure device.

The substrate carrying device includes a movable stage having a chuck and being movable in a horizontal direction, the chuck having a sucking surface which faces downward and sucking a substrate on the sucking surface; and a fixed blind disposed below the movable stage. The movable stage moves to a position apart from the fixed blind in a horizontal direction and attaches and detaches the substrate. In addition, the substrate carrying device also includes a lifting portion having a lifting table which is movable in a movable range of the movable stage and is capable of being positioned below the movable stage; and a carrying portion having a carrying arm which carries the substrate to the lifting portion.

11 Claims, 9 Drawing Sheets

U.S. PATENT DOCUMENTS

| | | | |
|---|---|---|---|
| 4,549,843 A * | 10/1985 | Jagusch et al. | 414/416.01 |
| 4,984,953 A | 1/1991 | Nakazato et al. | |
| 5,247,544 A | 9/1993 | LaRosa et al. | |
| 5,538,390 A | 7/1996 | Salzman | |
| 5,695,564 A | 12/1997 | Imahashi | |
| 6,090,176 A | 7/2000 | Yoshitake et al. | |
| 6,185,815 B1 | 2/2001 | Schindler | |
| 6,239,863 B1 | 5/2001 | Catey et al. | |
| 6,281,510 B1 | 8/2001 | Yoshitake et al. | |
| 6,317,479 B1 | 11/2001 | Chiba et al. | |
| 6,414,744 B1 * | 7/2002 | Kuiper et al. | 355/75 |
| 6,646,720 B2 | 11/2003 | Ramamoorthy et al. | |
| 6,728,332 B2 | 4/2004 | Chiba et al. | |
| 6,753,945 B2 | 6/2004 | Heerens et al. | |
| 6,813,002 B2 * | 11/2004 | Ota | 355/55 |
| 6,826,451 B2 | 11/2004 | del Puerto et al. | |
| 6,906,783 B2 | 6/2005 | del Puerto et al. | |
| 6,912,043 B2 | 6/2005 | Galburt | |
| 7,428,958 B2 * | 9/2008 | Tanaka | 198/468.9 |
| 7,483,123 B2 * | 1/2009 | Hirayanagi | 355/72 |
| 2002/0021435 A1 * | 2/2002 | Yamada | 355/72 |
| 2002/0109828 A1 * | 8/2002 | Moors et al. | 355/76 |
| 2002/0176096 A1 | 11/2002 | Sentoku et al. | |
| 2003/0162101 A1 | 8/2003 | Heerens et al. | |
| 2003/0227605 A1 | 12/2003 | del Puerto et al. | |
| 2004/0197169 A1 | 10/2004 | Soraoka et al. | |
| 2005/0057740 A1 | 3/2005 | del Puerto et al. | |
| 2005/0163598 A1 | 7/2005 | Yuasa et al. | |
| 2005/0231707 A1 | 10/2005 | Galburt | |

FOREIGN PATENT DOCUMENTS

| | | |
|---|---|---|
| JP | S63-208414 | 8/1988 |
| JP | 04-190408 | 7/1992 |
| JP | 4-190408 A | 7/1992 |
| JP | H06-002699 | 1/1994 |
| JP | 11-074182 | 3/1999 |
| JP | 2002-353099 A | 12/2002 |
| JP | 2003-065745 | 3/2003 |
| JP | 2003-65745 A | 3/2003 |
| JP | 2004-153122 | 5/2004 |
| JP | 2004-153122 A | 5/2004 |

OTHER PUBLICATIONS

European Search Report from European Patent Office dated Jan. 5, 2009, for Application No. 05806028.6-1226 / 1814142 PCT/JP2005020704, 6 pages.

* cited by examiner

SUBSTRATE CARRYING DEVICE, SUBSTRATE CARRYING METHOD, AND EXPOSURE DEVICE

This is a national stage application, based on PCT International Application No. PCT/JP05/20704, filed Nov. 11, 2005, and claims the benefit of priority of Japanese Application No. 2004-330356, filed Nov. 15, 2004.

TECHNICAL FIELD

The present invention relates to a substrate carrying device that carries a substrate such as a reticle, a substrate carrying method thereof, and an exposure device thereof.

BACKGROUND ART

Conventionally, as disclosed in for example the following patent document 1, a substrate carrying device that causes a carrying arm to carry a reticle to a lower position of a reticle stage and the reticle to be held onto the lower surface of the electrostatic chuck fixed on the lower side of the reticle stage is known.

Patent Document 1: Japanese Unexamined Patent Application Publication No. Hei 11-74182

DISCLOSURE OF THE INVENTION

Problems to be Solved by the Invention

However, the vertical alignment accuracy of a carrying arm normally used for the substrate carrying device disclosed in Patent Document 1 and so forth is lower than the horizontal alignment accuracy thereof. Thus, as a problem of related art, it was difficult to securely suck a reticle onto the lower surface of the electrostatic chuck.

The prevent invention is made from the foregoing point of view. An object of the present invention is to provide a substrate carrying device and a substrate carrying method that allow a substrate to be securely sucked onto the lower surface of a chuck. Another object of the present invention is to provide an exposure device that uses the substrate carrying device.

Effects of the Invention

In the substrate carrying device according to the present invention, in the state that the movable stage has been moved in the horizontal direction apart from the position of the fixed blind, a substrate is sucked onto the lower surface of the chuck of the movable stage. Thus, the substrate can be securely sucked onto the lower surface of the chuck.

In the substrate carrying method according to the present invention, after a substrate has been moved onto the lifting table by the carrying arm, the movable stage is moved above the lifting table and the lifting table is raised. As a result, the substrate is sucked onto the lower surface of the chuck of the movable stage. Thus, the substrate can be securely sucked onto the lower surface of the chuck.

In the exposure device according to the present invention, a substrate can be securely sucked onto the lower surface of the chuck. Thus, an exposure device that has high reliability can be obtained.

BEST MODE FOR CARRYING OUT THE INVENTION

Next, embodiments of the present invention will be described with reference to the accompanying drawings.

First Embodiment

Figure 1:
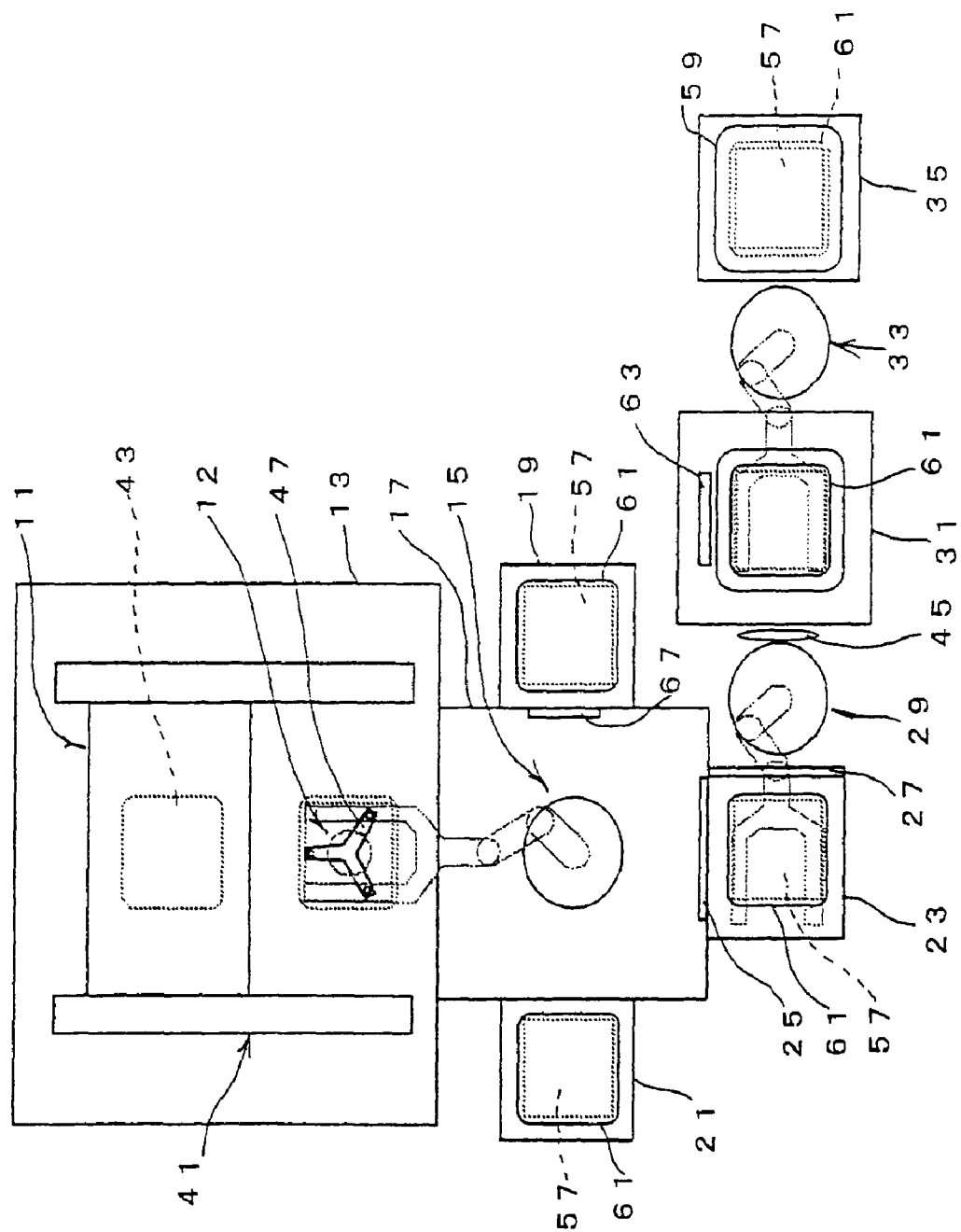
FIG. 1 is a schematic diagram describing a substrate carrying device according to a first embodiment of the present invention.

FIG. 1 shows a substrate carrying device according to a first embodiment of the present invention.

The substrate carrying device has an exposure chamber 13 in which a reticle stage 11 and a lifting portion 12 are disposed. Disposed on one side of the exposure chamber 13 is a robot chamber 17 in which a vacuum robot 15 is disposed. Disposed on one side of the robot chamber 17 is a vacuum reticle library 19. Disposed on another side of the robot chamber 17 is a clean filter pod opener (hereinafter referred to as the CFP opener) 21. The exposure chamber 13, the robot chamber 17, the vacuum reticle library 19, and the CFP opener 21 are disposed in vacuum atmosphere.

Disposed adjacent to the robot chamber 17 opposite to the exposure chamber 13 is a load lock chamber 23. The load lock chamber 23 is in communication with the robot chamber 17 through a second gate valve 25. In addition, the load lock chamber 23 is in communication with atmospheric air through a first gate valve 27.

Disposed outside the load lock chamber 23 is a reticle carrier opener 31 through a second atmospheric air robot 29. Disposed outside the reticle carrier opener 31 is an atmospheric air reticle library 35 through a first atmospheric air robot 33.

Figure 2:
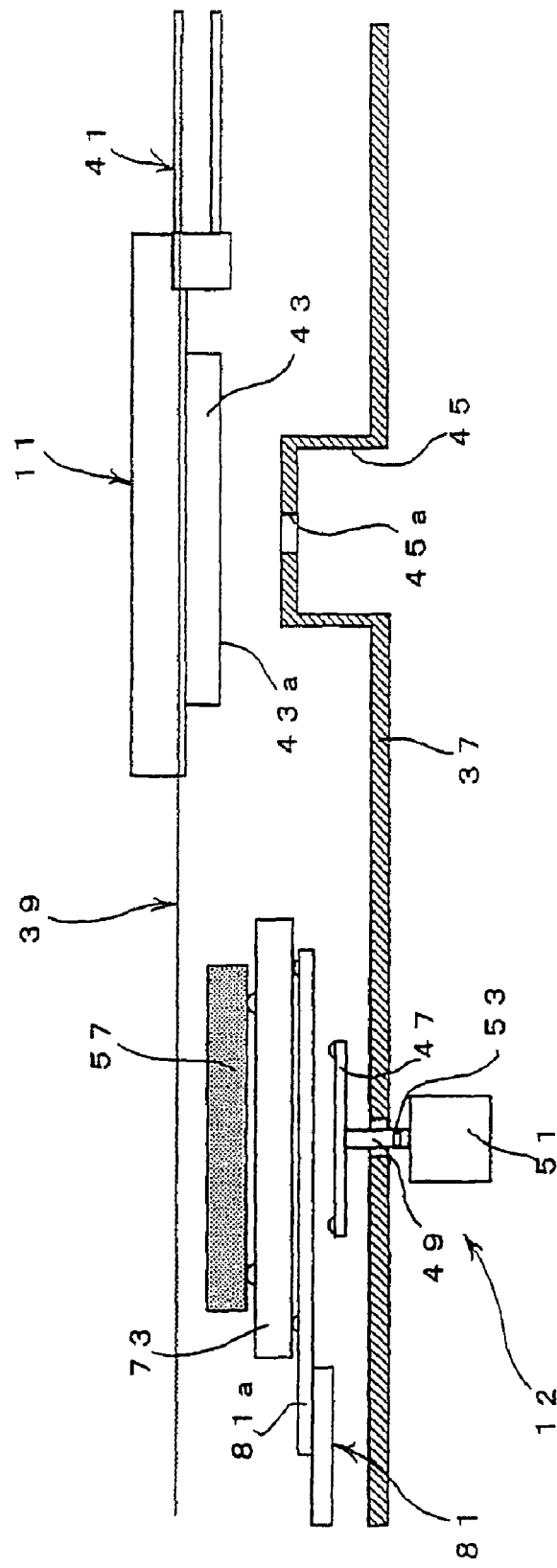
FIG. 2 is a schematic diagram describing details of a lifting portion and a reticle stage shown in FIG. 1.

FIG. 2 shows details of the reticle stage 11 and the lifting portion 12 disposed in the exposure chamber 13.

The reticle stage 11 is disposed above a thermophoresis plate 37. A cooling medium is circulated in the thermophoresis plate 37 and thereby it is cooled at a predetermined temperature. When the thermophoresis plate 37 is cooled in such a manner, microscopic contaminant migrates to the thermophoresis plate 37 side. Formed on the upper side of the thermophoresis plate 37 is a thermophoresis operation area 39 where the amount of contaminant is very small.

The reticle stage 11 is a movable stage horizontally movable by a guide portion 41 (roughly illustrated). Secured on the lower side of the reticle stage 11 is an electrostatic chuck 43. Formed in the thermophoresis plate 37 below the electrostatic chuck 43 is a fixed blind 45. The fixed blind 45 protrudes toward the electrostatic chuck 43 side. Formed at the center of the fixed blind 45 is a hole portion 45a that allows EUV light to pass.

The lifting portion 12 has a lifting table 47. The lifting table 47 is disposed in the thermophoresis operation area 39 above the thermophoresis plate 37. In addition, the lifting portion 12 is disposed such that it can be positioned below the reticle stage 11. The lifting table 47 is supported at an upper end of a lifting shaft 49. The lifting shaft 49 extends downward through the thermophoresis plate 37. Disposed at a lower end of the lifting shaft 49 is a lifting mechanism 51 that raises and lowers the lifting shaft 49. Disposed at the lifting shaft 49 is a force sensor 53 that measures a force that acts on the lifting table 47. This force sensor 53 is composed of a distortion gauge, a piezoelectric element, or the like.

Figure 3:
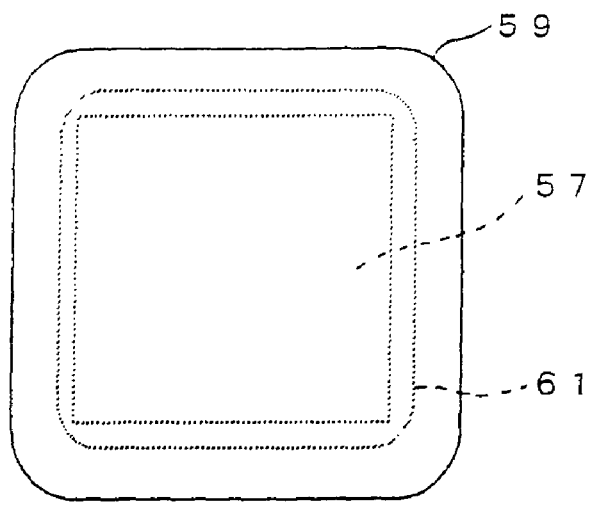
FIG. 3 is a schematic diagram describing a reticle carrier.

As shown in FIG. 3, a reticle 57 used for exposure with EUVL is placed in the atmospheric air reticle library 35 of the foregoing substrate carrying device in such a manner that the reticle 57 is protected by both a reticle carrier 59 and a clean filter pod (hereinafter referred to as the CFP) 61. The CFP 61 has a function as a protection cover that protects the reticle 57 in reduced-pressure atmospheric air.

The reticle carrier 59 placed in the atmospheric air reticle library 35 is carried to the reticle carrier opener 31 by the first atmospheric air robot 33. Thereafter, a reticle carrier ID reader 63 identifies the reticle carrier 59. The reticle carrier opener 31 opens the reticle carrier 59 and thereby the CFP 61 is exposed. The temperature of the exposed CFP 61 is raised for around 2 to 3° C. by a temperature compensation lamp 45. The CFP 61 that has been temperature-raised is carried into the load lock chamber 23 by the second atmospheric air robot 29 in the state that only the first gate valve 27 is open. The path from the reticle carrier opener 31 to the load lock chamber 23 is in clean atmospheric air.

In the load lock chamber 23, the CFP 61 is evacuated in the state that the first gate valve 27 and the second gate valve 25 are closed. When the interior of the load lock chamber 23 becomes a predetermined vacuum state, only the second gate valve 25 is opened and the CFP 61 is carried into the vacuum reticle library 19 by the vacuum robot 15.

In the vacuum reticle library 19, the CFP 61 that accommodates for example around five reticles 57 is stored. The reticles 57 are kept at a predetermined temperature by a temperature adjustment mechanism (not shown). The reticles 57 accommodated in the CFP 61 are identified by a reticle ID reader 67. The identified reticles 57 accommodated in the CFP 61 are carried to the CFP opener 21 by the vacuum robot 15.

In the CFP opener 21, the CFP 61 is opened and thereby the reticles 57 are exposed.

Figure 4:
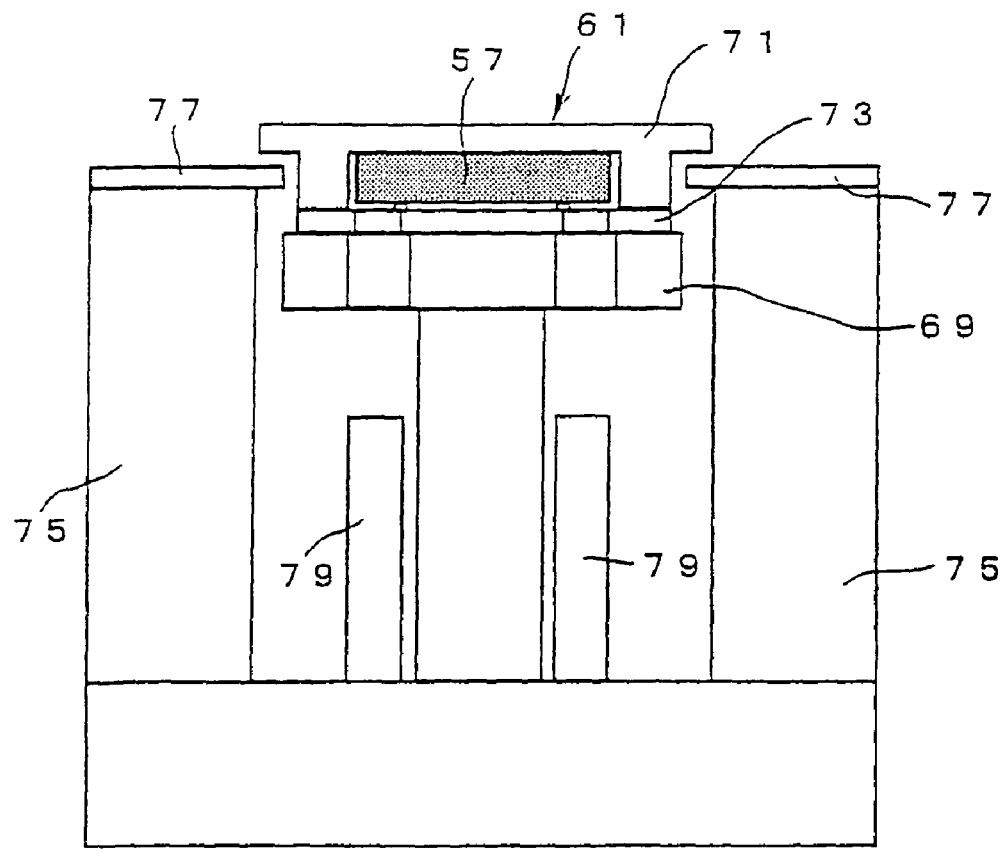
FIG. 4 is a schematic diagram describing details of a CFP stage shown in FIG. 1.
Figure 5:
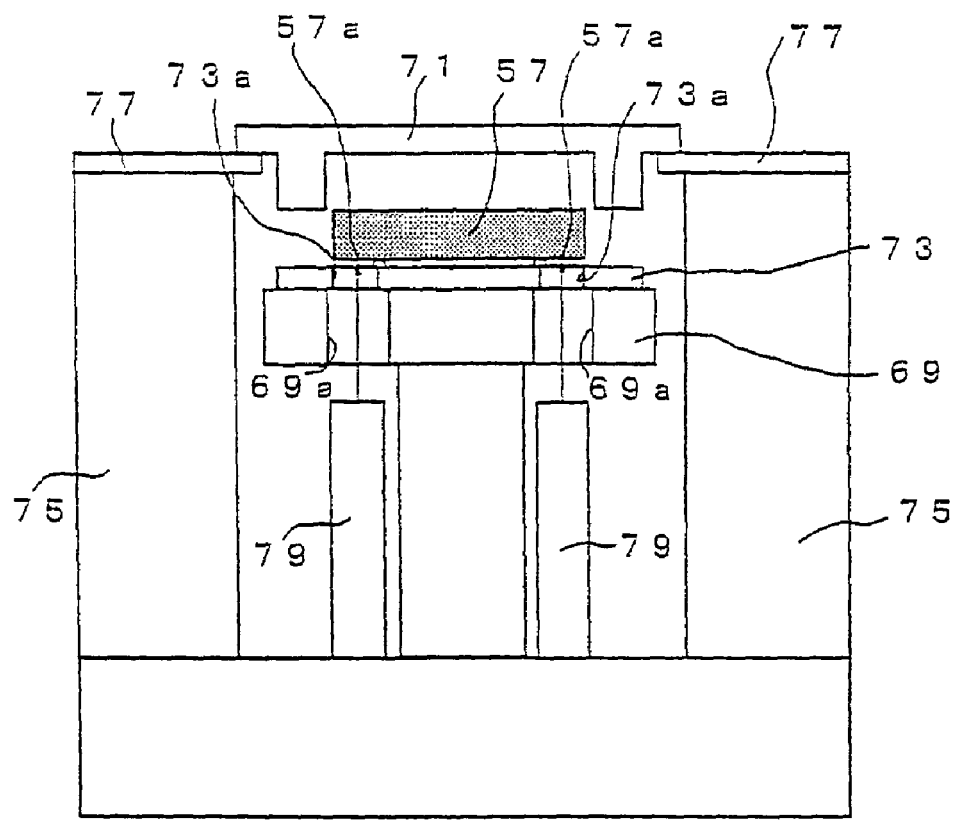
FIG. 5 is a schematic diagram describing the state that a reticle is exposed from the CFP in FIG. 4.

In this embodiment, as shown in FIG. 4, the CFP 61 carried to the CFP opener 21 is placed on a CFP stage 69. The CFP 61 is composed of a cover member 71 and a base member 73. As shown in FIG. 5, by lowering the CFP stage 69, an outer circumferential portion of the cover member 71 is locked by a locking member 77 at an upper end of a supporting member 75 and thereby a reticle 57 is exposed.

In this embodiment, disposed below the CFP stage 69 is a reference microscope 79 that pre-aligns a reticle 57. The reference microscope 79 detects pre-alignment marks 57a formed on a lower surface of a reticle 57 through throughholes 69a formed in the CFP stage 69 and transparent windows 73a formed in the base member 73. As a result, the CFP stage 69 is driven and thereby the reticle 57 is pre-aligned. At this point, by detecting a reticle ID such as a barcode formed on the reticle 57 through the transparent windows 73a of the base member 73, the reticle ID can be identified.

The reticle 57 that has been pre-aligned is carried onto the lifting table 47 of the lifting portion 12 by an end effecter 81a of a carrying arm 81 of the vacuum robot 15 in the state that the reticle 57 is placed on the base member 73 of the CFP 61 as shown in FIG. 2.

Figure 6:
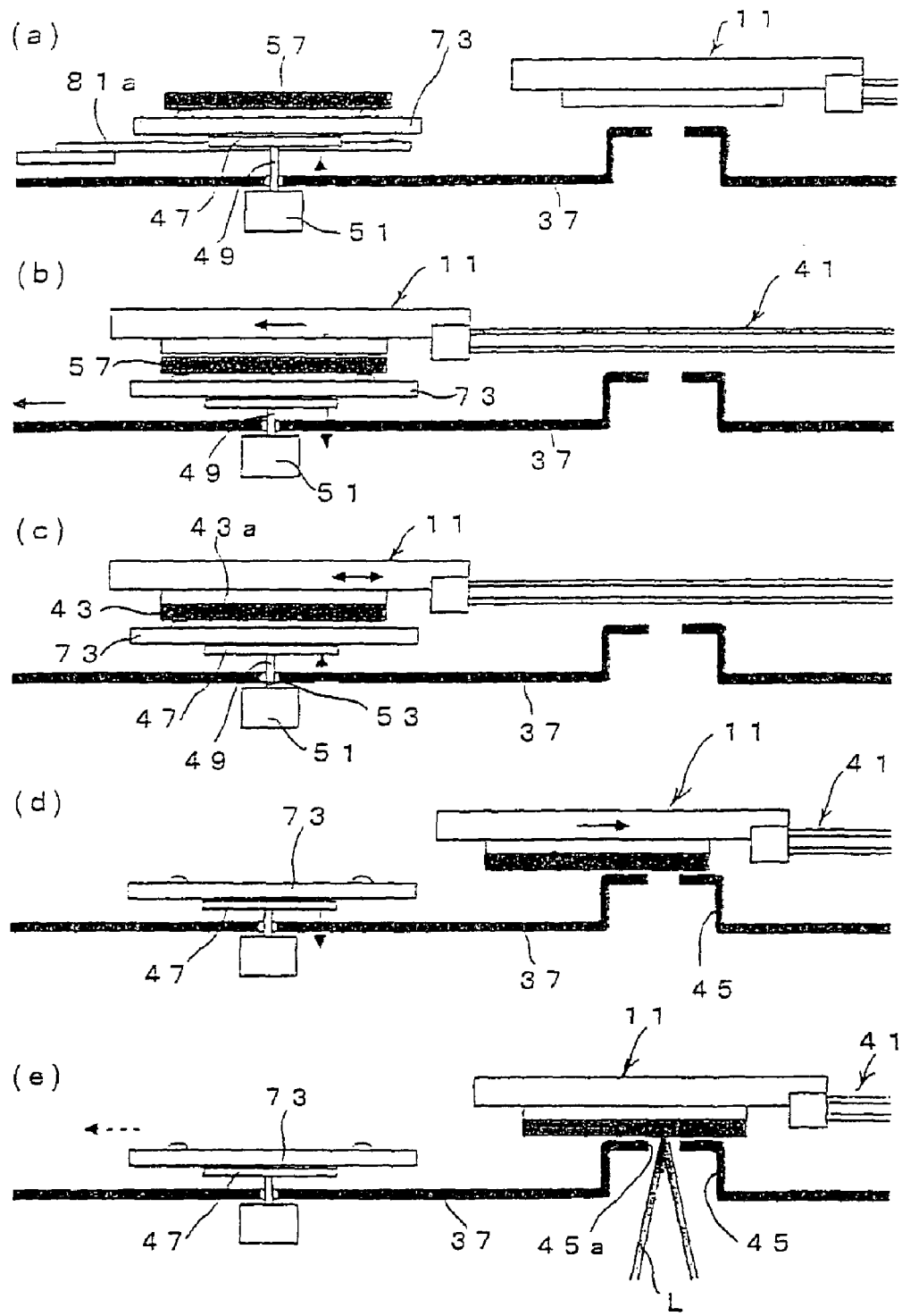
FIG. 6 is a schematic diagram describing the state that a reticle is carried from the CFP stage shown in FIG. 1 to the reticle stage.

Thereafter, as shown in FIG. 6(a), the lifting shaft 49 is raised by the lifting mechanism 51 and thereby the base member 73 is placed on the upper surface of the lifting table 47. As a result, the end effecter 81a is separated from the base member 73.

Thereafter, as shown in FIG. 6(b), after the end effecter 81a has been retreated, the lifting shaft 49 is lowered and thereby the base member 73 and the reticle 57 are lowered. In this state, the reticle stage 11 is moved immediately above the reticle 57 by the guide portion 41.

Thereafter, as shown in FIG. 6(c), the lifting shaft 49 is raised by the lifting mechanism 51. The reticle 57 is sucked onto the lower surface of the electrostatic chuck 43 of the reticle stage 11. In other words, when the electrostatic chuck 43 is turned on in the state that the reticle 57 is being pressed onto a sucking surface 43a of the electrostatic chuck 43 through the base member 73 by the lifting table 47, the upper surface of the reticle 57 is sucked onto the sucking surface 43a.

In this embodiment, a pressing pressure at which the reticle 57 is pressed onto the sucking surface 43a of the electrostatic chuck 43 is detected by the force sensor 53 and the reticle 57 is pressed onto the sucking surface 43a with predetermined pressing force. Thus, the reticle 57 can be securely pressed onto the sucking surface 43a with predetermined force.

Thereafter, as shown in FIG. 6(d), the reticle stage 11 is moved toward the fixed blind 45 by the guide portion 41. Thus, only the base member 73 is left on the lifting table 47.

Thereafter, as shown in FIG. 6(e), the reticle stage 11 is moved to an exposure position immediately above the fixed blind 45 by the guide portion 41. At this point, the space between the lower surface of the reticle 57 and the upper surface of the fixed blind 45 is as small as around 1 mm. EUV light L enters from a hole portion of the fixed blind 45. Exposure is performed by EUV light L reflected from the reticle 57.

Figure 7:
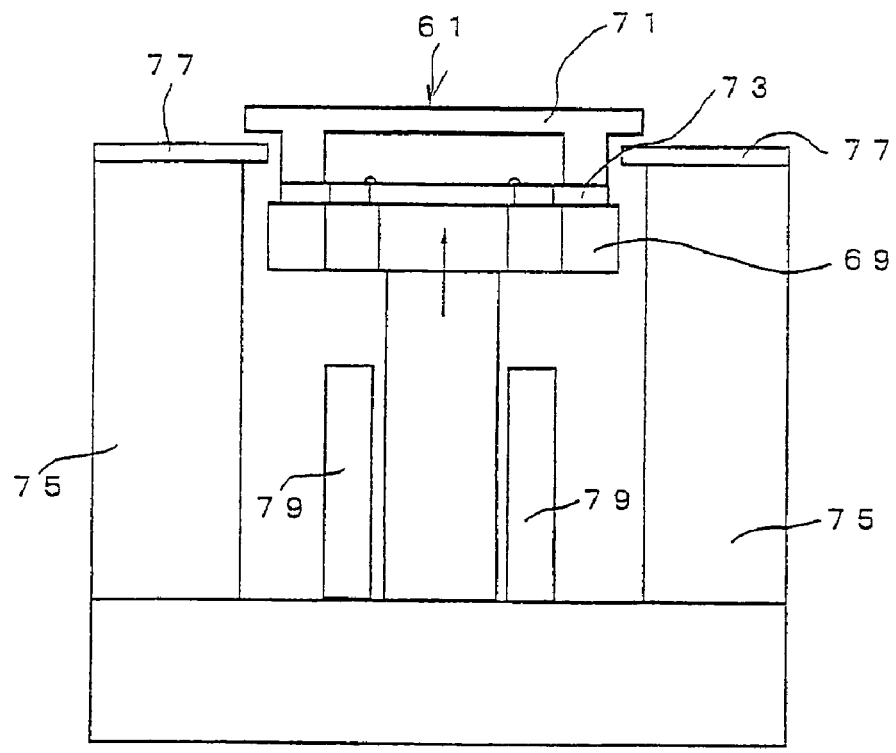
FIG. 7 is a schematic diagram describing the state that the CFP is on standby in the CFP stage shown in FIG. 1.

On the other hand, the base member 73 on the lifting table 47 is collected by the end effecter 81a. The carrying arm 81 carries the base member 73 to the CFP opener 21 and places the base member 73 on the CFP stage 69 that has been lowered as shown in FIG. 5. Thereafter, as shown in FIG. 7, when the CFP stage 69 is raised, the cover member 71 and the base member 73 are brought into contact with each other and thereby the interior of the cover member 71 and the base member 73 are sealed. As a result, the base member 73 and the cover member 71 are prevented from being contaminated.

After exposure has been completed, when the reticle on the reticle stage 11 is replaced with another reticle 57, by lowering the CFP stage 69, the base member 73 is lowered and separated from the cover member 71 of the CFP 61 (this state corresponds to the state shown in FIG. 5 except that there is no reticle 57) and then the base member 73 is carried onto the lifting table 47 of the lifting portion 12 by the carrying arm 81.

After the reticle stage 11 is moved above the lifting table 47, in the state that the base member 73 is in contact with the reticle 57 sucked by the electrostatic chuck 43 of the reticle stage 11, the electrostatic chuck 43 is turned off. As a result, the reticle 57 is placed on the base member 73. In this state, the reticle 57 is carried to the CFP opener 21 by the carrying arm 81. As shown in FIG. 5, the base member 73 is placed on the CFP stage 69 that has been lowered. By raising the CFP stage 69, the cover member 71 and the base member 73 of the CFP 61 are brought into contact with each other (refer to FIG. 4) and thereby the CFP 61 that accommodates the reticle 57 is sealed.

In the foregoing embodiment, after a reticle 57 is placed on the lifting table 47 by the carrying arm 81, the reticle stage 11 is moved above the lifting table 47 and then the lifting table 47 is raised. As a result, the reticle 57 is sucked onto the lower surface of the electrostatic chuck 43 on the reticle stage 11. Thus, the reticle 57 can be quickly and accurately sucked onto the lower surface of the electrostatic chuck 43.

In other words, since the vertical alignment accuracy of the carrying arm 81 of the vacuum robot 15 is lower than the horizontal alignment accuracy thereof, it is difficult to cause the reticle 57 to be directly sucked onto the lower surface of the electrostatic chuck 43 using the carrying arm 81. However, by causing the reticle 57 to be sucked onto the lower surface of the electrostatic chuck 43 through the lifting table 47, the reticle 57 can be securely sucked onto the lower surface of the electrostatic chuck 43.

In the foregoing embodiment, when the reticle stage 11 is moved to the exposure position, the space between the lower surface of the reticle 57 and the upper surface of the fixed blind 45 is as small as around 1 mm. Thus, in the exposure device, it is difficult to cause the reticle 57 to be directly sucked onto the lower surface of the electrostatic chuck 43 using the carrying arm 81. However, by moving the reticle stage 11 above the lifting table 47 and causing the reticle 57 to be sucked onto the lower surface of the electrostatic chuck 43, the reticle 57 can be securely sucked onto the lower surface of the electrostatic chuck 43.

In the foregoing embodiment, while the reticle 57 is being used for exposure, the cover member 71 and the base member 73 of the CFP 61 are closed and thereby the interior of the cover member 71 and the base member 73 is sealed. Thus, while the reticle 57 is being used for exposure, the interior of the CFP 61 can be securely prevented from being contaminated. Since the interior of the CFP 61 is not contaminated, the risk of which the reticle 57 is contaminated is very low.

Second Embodiment

Figure 8:
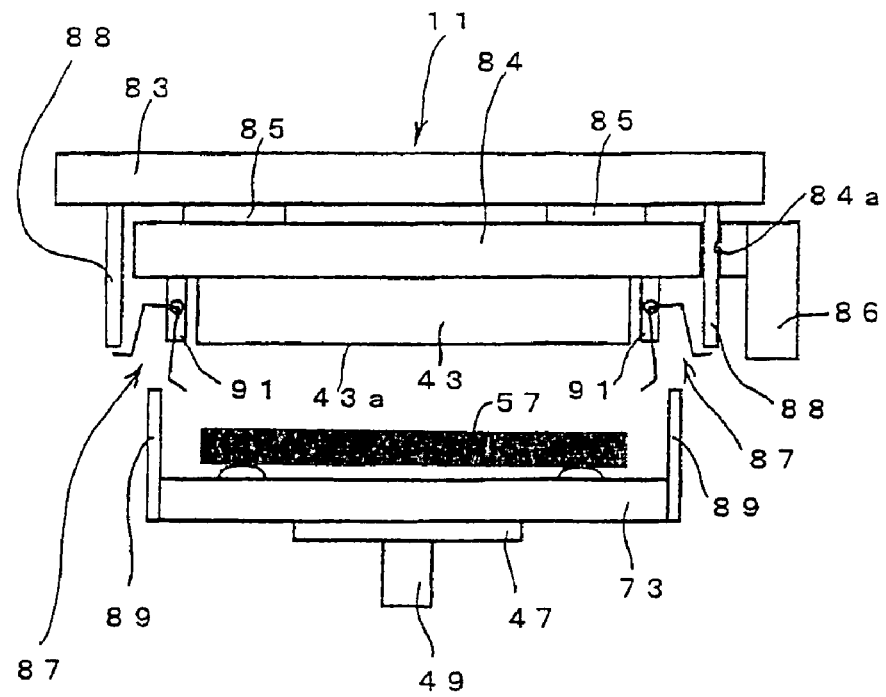
FIG. 8 is a schematic diagram describing a substrate carrying device according to a second embodiment of the present invention.

FIG. 8 shows a substrate carrying device according to a second embodiment of the present invention.

In this embodiment, similar portions to those in the first embodiment will be represented by similar reference numerals and their detailed description will be omitted.

In this embodiment, the reticle stage 11 has a coarse moving stage 83 and a fine moving table 84.

The coarse moving stage 83 is movable in the horizontal direction. Disposed below the coarse moving stage 83 is the fine moving table 84 through a Z actuator 85. The Z actuator 85 raises and lowers the fine moving table 84. The fine moving table 84 is movable in the horizontal direction and the vertical direction and rotatable on a horizontal plane. Fixed on a side surface of the fine moving table 84 is a moving mirror 86 that measures the position of the fine moving table 84. Fixed on a lower side of the fine moving table 84 is an electrostatic chuck 43 whose sucking surface 43a faces downward.

In this embodiment, a drop prevention portion is disposed on each side of the electrostatic chuck 43. The drop prevention portion has a drop prevention member 87, a holding member 88, and a release member 89.

The drop prevention member 87 is rotatably disposed around a supporting member 91 fixed on each side of the lower surface of the fine moving table 84. The holding member 88 is formed in a pin shape and fixed on each side of the lower surface of the coarse moving stage 83 such that the holding member 88 faces downward. The holding member 88 on one side pierces into a through-hole 84a formed in the fine moving table 84. The release member 89 is formed in a pin shape and fixed on each side surface of the CFP 61 such that the release member 89 faces upward.

Figure 9:
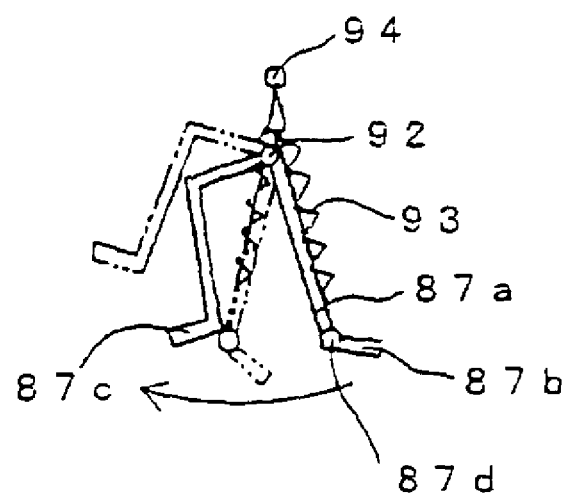
FIG. 9 is a schematic diagram describing details of a drop prevention member shown in FIG. 8.

FIG. 9 shows details of the drop prevention member 87.

The drop prevention member 87 has a "]" shaped body portion 87a. Formed at an end portion of the body portion 87a on the electrostatic chuck 43 side is a holding nail 87b. Formed at an end portion of the body portion 87a on the opposite side is a pressing portion 87c. The drop prevention member 87 has a toggle mechanism composed of a hinge 92 and a coil spring 93. The drop prevention member 87 can be held at two positions of the electrostatic chuck 43 side and the holding member 88 side. In this embodiment, a lower end of the coil spring 93 is fixed at a fixing portion 87d on the base of the holding nail 87b and an upper end of the coil spring 93 is fixed at a fixing portion 94 above the hinge 92.

Figure 10:
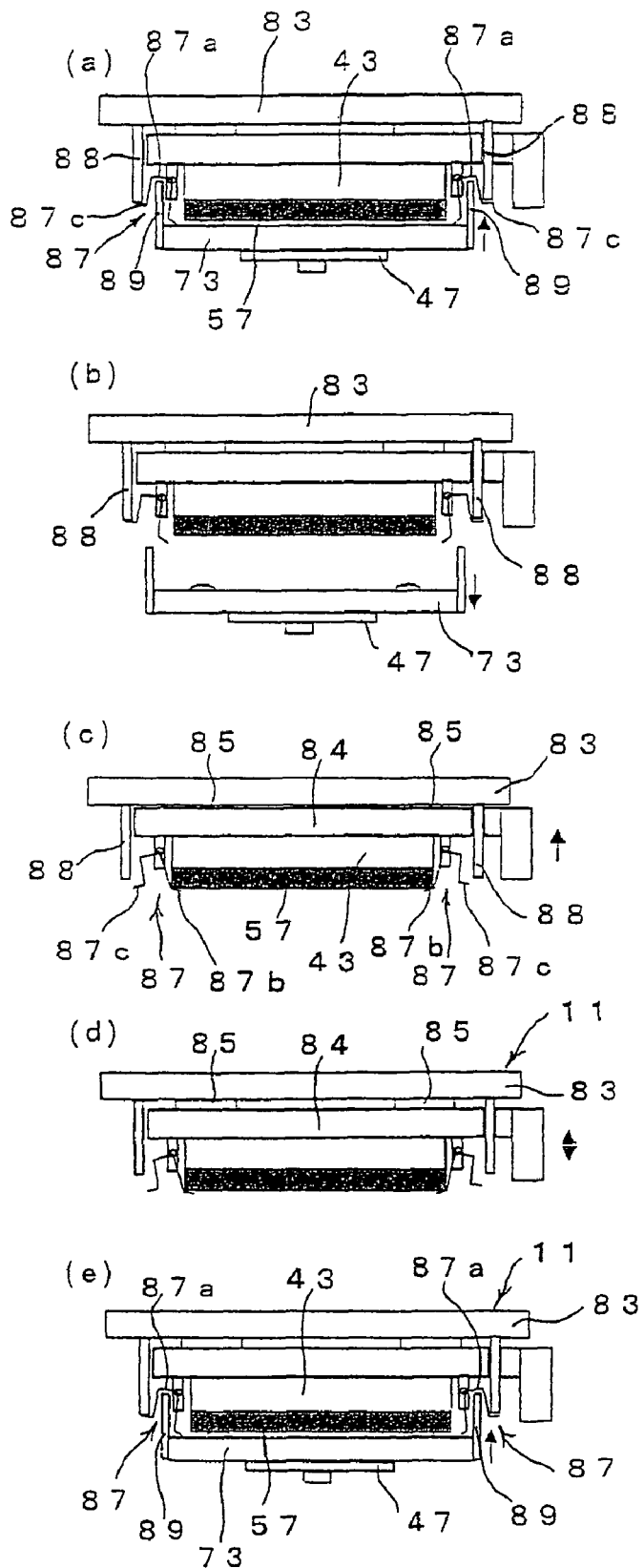
FIG. 10 is a schematic diagram describing a method of attaching and detaching a reticle to and from an electrostatic chuck shown in FIG. 8.

In this embodiment, as shown in FIG. 10, a reticle 57 is sucked to and released from the electrostatic chuck 43.

First of all, as shown in FIG. 10(a), when the lifting table 47 is raised, the release members 89 disposed on both the sides of the base member 73 of the lifting table 47 are inserted into the body portions 87a of the drop prevention members 87 and thereby the drop prevention members 87 are rotated outward. In this state, the reticle 57 placed on the base member 73 is pressed onto the lower surface of the electrostatic chuck 43 and sucked by the electrostatic chuck 43. In this state, the lower ends of the holding members 88 fixed to the coarse moving stage 83 are positioned near the pressing portions 87c of the drop prevention members 87.

Thereafter, as shown in FIG. 10(b), the lifting table 47 is lowered and thereby the base member 73 of the CFP 61 is retracted.

Thereafter, as shown in FIG. 10(c), the fine moving table 84 is raised by the Z actuator 85 and thereby the lower ends of the holding members 88 press the pressing portions 87c of the drop prevention members 87, causing the drop prevention member 87 to be rotated on the electrostatic chuck 43 side. Thus, the holding nails 87b of the drop prevention members 87 are locked to the outer circumference of the reticle 57 sucked by the electrostatic chuck 43 and thereby the reticle 57 is held.

Thereafter, as shown in FIG. 10(d), the reticle stage 11 is moved to an exposure position and the upper and lower positions of the fine moving table 84 are adjusted by the Z actuator 85. After the upper and lower positions of the fine moving table 84 have been adjusted, exposure is performed.

Thereafter, as shown in FIG. 10(e), the reticle stage 11 is placed above the lifting table 47 and then the lifting table 47 is raised, causing the release members 89 disposed on both sides of the base member 73 of the CFP 61 to be inserted into the body portions 87a of the drop prevention members 87, then the drop prevention members 87 to be rotated outward, and thereby the reticle 57 to be released from the drop prevention members 87.

In this embodiment, the same effect as the first embodiment can be obtained. However, in this embodiment, since the reticle 57 sucked by the electrostatic chuck 43 is held by the holding nails 87b of the drop prevention members 87, the reticle 57 can be securely prevented from accidentally dropping.

In addition, since the drop prevention members 87 are rotated by the holding members 88 and the release members 89, the reliability can be improved in comparison with the case that the drop prevention members 87 are rotated using electricity or fluid.

(Exposure Device of Embodiment)

Figure 11:
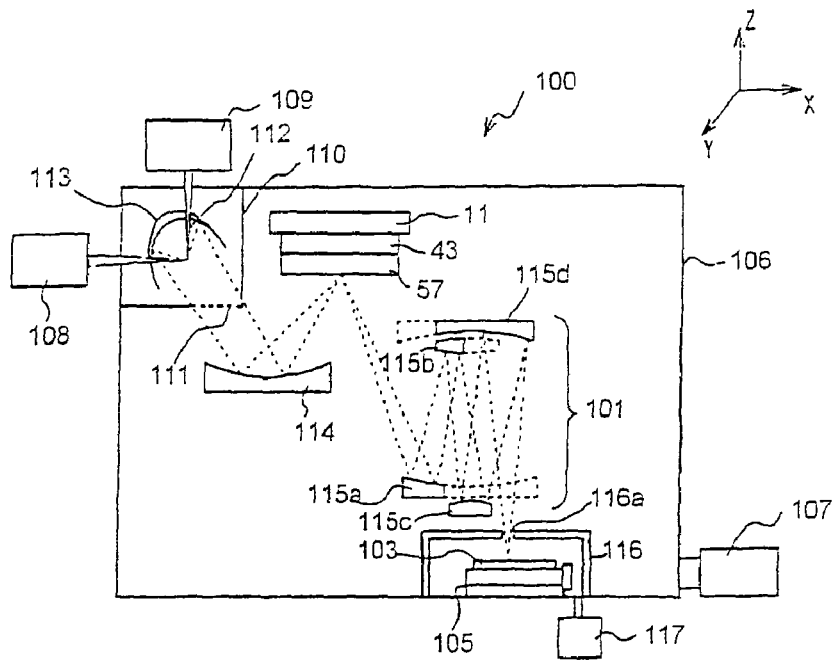
FIG. 11 is a schematic diagram describing an exposure device according to an embodiment of the present invention.

FIG. 11 is a schematic diagram showing an EUV light lithography system in the exposure chamber 13 shown in FIG. 1.

In this embodiment, similar portions to those in the first embodiment will be represented by similar reference numerals. In this embodiment, as illumination light for exposure, EUV light is used. EUV light has wave lengths ranging from 1 to 400 nm. In this embodiment, it is preferred that EUV light have wave lengths ranging from 1 to around 50 nm. A projection image is generated by an image optical system 101. The image optical system 101 forms a reduced image of a pattern of a reticle 57 on a wafer 103.

A pattern with which the wafer 103 is irradiated depends on a reflection type reticle 57 placed on a lower side of the reticle stage 11 through the electrostatic chuck 43. The reflection type reticle 57 is loaded and unloaded by the vacuum robot 15 described in the foregoing embodiment (the illustration of the vacuum robot 15 is omitted). The wafer 103 is placed on a wafer stage 105. Typically, the wafer 103 is exposed based on the step-scan method.

Since EUV light used as illumination light for exposure has low transmissivity to air, an optical path through which EUV light passes is surrounded by a vacuum chamber 106 evacuated by an appropriate vacuum pump 107. EUV light is generated by a laser-plasma X ray source. The laser-plasma X ray source is composed of a laser source 108 (that operates as an exciting light source) and a xenon gas supply device 109. The laser-plasma X ray source is surrounded by a vacuum chamber 110. EUV light generated by the laser-plasma X ray source passes through a window 111 of the vacuum chamber 110.

The laser source 108 generates laser light having wave lengths shorter than those of ultraviolet light. The laser source 108 is for example a YAG laser or an excimer laser. Laser light emitted from the laser source 108 is condensed and a flow of xenon gas emitted from a nozzle 112 (supplied from a xenon gas supply device 109) is irradiated with the condensed light. When the flow of xenon gas is irradiated with laser light, the laser light sufficiently heats xenon gas, causing a plasma to occur. When the energy state of molecules of xenon gas excited by the laser drops to a low energy state, photons of EUV light are emitted.

A parabolic mirror 113 is disposed near a xenon gas emission portion. The parabolic mirror 113 condenses EUV light generated by the plasma. The parabolic mirror 113 composes a light condensing optical system. The parabolic mirror 113 is disposed such that its focus point nearly matches the position at which xenon gas is emitted from the nozzle 112. EUV light is reflected on a laminate film of the parabolic mirror 113 and reaches a condensing mirror 114 through a window 111 of the vacuum chamber 110. The condensing mirror 114 condenses EUV light and reflects it to the reflection type reticle 57. EUV light is reflected by the condensing mirror 114 and illuminates a predetermined portion of the reticle 57. In other words, the parabolic mirror 113 and the condensing mirror 114 compose a lighting system of the device.

The reticle 57 has a laminate film that reflects EUV light and a absorption pattern layer that forms a pattern. EUV light is reflected on the reticle 57, causing EUV light to be "patterned". The patterned EUV light reaches the wafer 103 through the projection system 101.

The image optical system 101 according to this embodiment is composed of four reflection mirrors that are a concave first mirror 115a, a convex second mirror 115b, a convex third mirror 115c, and a concave fourth mirror 115d. Each of the mirrors 115a to 115d has a laminate film that reflects EUV light.

EUV light reflected by the reticle 57 is successively reflected by the first mirror 115a to the fourth mirror 115d and thereby a reduced image (for example, the size of ¼, ⅕, and ⅙ of the original image) of the pattern of the reticle 57 is formed. The image optical system 101 is telecentric on the image side (wafer 103 side).

The reticle 57 is supported at least on the X-Y plane by the movable reticle stage 11. The wafer 103 is supported by the wafer stage 105 that is movable preferably in the X, Y, and Z directions. When dice on the wafer 103 are exposed, a predetermined area of the reticle 57 is irradiated with EUV light by the lighting system. The reticle 57 and the wafer 103 are moved against the image optical system 101 at a predetermined speed corresponding to a reduction rate of the image optical system 101. Thus, the pattern of the reticle 57 is exposed in a predetermined exposure range (dice) on the wafer 103.

It is preferred that when the wafer 103 is exposed, it be disposed behind a partition 116 to prevent gas that occurs in resist on the wafer 103 from adversely affecting the mirrors 115a to 115d of the image optical system 101. The partition 116 has an opening 116a. The wafer 103 is irradiated with EUV light emitted from the mirror 115d through the opening 116a. The inner space of the partition 116 is evacuated by a vacuum pump 117. In such a manner, gaseous impurities that occur in resist irradiated with EUV light can be prevented from adhering onto the mirrors 115a to 115e or the reticle 57. Thus, these optical performance can be prevented from deteriorating.

In the exposure device according to this embodiment, the reticle 57 can be securely sucked onto the lower surface of the electrostatic chuck 43. Thus, an exposure device having high reliability can be obtained.

In addition, since the reticle 57 is carried by the foregoing substrate carrying device, products can be obtained with high yield using the reticle 57 that is less contaminated.

(Supplementary Description of Embodiments)

The present invention has been described with the foregoing embodiments. However, the scope of the present invention is not limited to these embodiments. Instead, the present invention may be embodied for example in the following modes.

Figure 12:
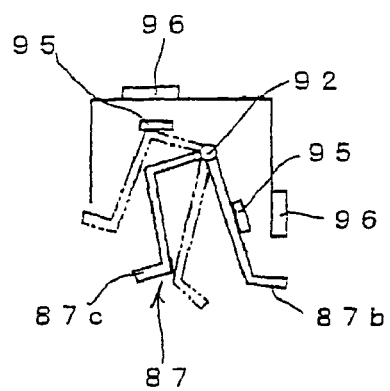
FIG. 12 is a schematic diagram describing another method of holding the drop prevention member.

(1) In the foregoing embodiments, the case of which the rotation position of the drop prevention members 87 is kept by the toggle mechanism using the hinges 92 and the coil springs 93 was exemplified. Instead, as exemplified in FIG. 12, a permanent magnet 95 may be secured to the drop prevention member 87 and the permanent magnet 95 may be attracted by a ferromagnetic material 96 side.

Figure 13:
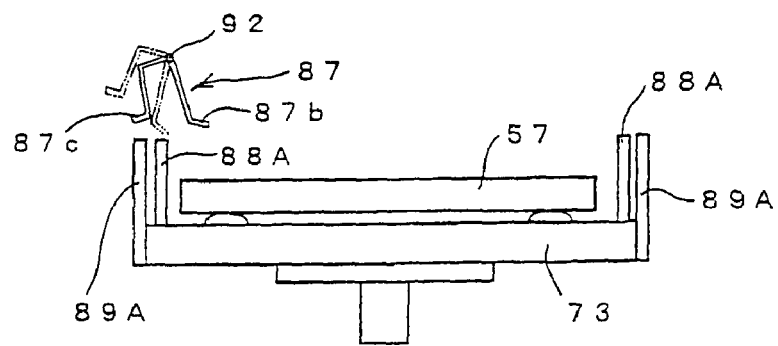
FIG. 13 is a schematic diagram describing another example of a holding member and a releasing member.

(2) In the foregoing embodiments, the case of which the holding member 88 is secured to the coarse moving stage 83 and the release member 89 is secured to the base member 73 of the CFP 61 was exemplified. Instead, as exemplified in FIG. 13, a holding member 88A and a release member 89A may be secured to the base member 73. In addition, a holding member or a release member may be secured to the lifting table 47.

(3) In the foregoing embodiments, an exposure device using EUV light was exemplified. Instead, the present invention may be widely applied to an exposure device that uses charged particle beam, i beam, g beam, Krf, ArfF, or F2.

The invention claimed is:

1. A substrate carrying device, comprising:
   a movable stage having a chuck and being movable in a horizontal direction, said chuck having a sucking surface which faces downward and sucking a substrate on said sucking surface;
   a lifting portion having a lifting mechanism which raises and lowers a lifting table which is movable in a movable range of said movable stage and is capable of being positioned below said movable stage;
   a fixed blind disposed below said movable stage; and
   a thermophoresis plate which is situated below said lifting table, and which is cooled at a predetermined temperature,
   wherein said movable stage moves to a position apart from said fixed blind in a horizontal direction and attaches and detaches said substrate above said thermophoresis plate, and said lifting mechanism is situated below said thermophoresis plate.

2. The substrate carrying device as set forth in claim 1,
   wherein said substrate accommodated in a protection pod having a base member and a cover member which are separable is carried to said lifting table by a carrying arm with said base member in a state that said protection pod is being separated into said base member and said cover member.

3. The substrate carrying device as set forth in claim 1,
   wherein said lifting portion has a measuring portion which measures a force which acts on said lifting table.

4. The substrate carrying device as set forth in claim 1, further comprising:
   a drop prevention portion which prevents an accidental dropping of said substrate sucked by said chuck.

5. The substrate carrying device as set forth in claim 4,
   wherein said drop prevention portion has:
   a drop prevention member rotatably disposed on said movable stage side;
   a substrate holding portion which rotates said drop prevention member to cause said drop prevention member to hold said substrate sucked by said chuck; and
   a release portion which rotates said drop prevention member as said lifting table rises to cause said drop prevention member to release said substrate.

6. The substrate carrying device as set forth in claim 5,
   wherein said movable stage having a coarse moving stage and a fine moving table which is disposed below said coarse moving stage, said fine moving table being movable in upper and lower directions, said chuck being disposed below said fine moving table, and
   wherein said substrate holding portion is a holding member which protrudes downward from said coarse moving stage.

7. The substrate carrying device as set forth in claim 5, further comprising:
   a drop prevention member holding portion which holds said drop prevention member at a hold position of said substrate or at a release position of said substrate.

8. The substrate carrying device as set forth in claim 7,
   wherein said drop prevention member holding portion has a toggle mechanism composed of a hinge and a spring which holds said drop prevention member.

9. The substrate carrying device as set forth in claim 7,
   wherein said drop prevention member holding portion magnetically holds said drop prevention member.

10. A substrate conveying method, comprising the steps of:
    causing a carrying arm to place a substrate onto a lifting table above a thermophoresis plate which is cooled at a predetermined temperature;
    causing a movable stage to move above said lifting table;
    causing said lifting table to move upward by a lifting mechanism which is situated below said thermophoresis plate so as to cause said substrate to be sucked onto a lower surface of a chuck of said movable stage; and
    causing said moveable stage to move in a horizontal direction to a place above a fixed blind.

11. An exposure device having a substrate carrying device as set forth in claim 1.

* * * * *

UNITED STATES PATENT AND TRADEMARK OFFICE
CERTIFICATE OF CORRECTION

| | | |
|---|---|---|
| PATENT NO. | : 7,916,268 B2 | Page 1 of 1 |
| APPLICATION NO. | : 11/667597 | |
| DATED | : March 29, 2011 | |
| INVENTOR(S) | : Keiichi Tanaka | |

It is certified that error appears in the above-identified patent and that said Letters Patent is hereby corrected as shown below:

In claim 10, column 10, line 39, "moveable" should read --movable--.

Signed and Sealed this
Twenty-seventh Day of September, 2011

David J. Kappos
*Director of the United States Patent and Trademark Office*